(12) United States Patent
Woody et al.

(10) Patent No.: US 10,910,917 B2
(45) Date of Patent: Feb. 2, 2021

(54) COMPACT THERMALLY EFFICIENT TRACTION MOTOR INVERTER

(71) Applicants: George R Woody, Anaheim, CA (US); Nayeem Arafat, Rancho Cucamonga, CA (US); Lon C Cooper, San Dimas, CA (US)

(72) Inventors: George R Woody, Anaheim, CA (US); Nayeem Arafat, Rancho Cucamonga, CA (US); Lon C Cooper, San Dimas, CA (US)

(73) Assignee: Beijing E. Motor Advance Co. Ltd., Beijing (CN)

( * ) Notice: Subject to any disclaimer, the term of this patent is extended or adjusted under 35 U.S.C. 154(b) by 0 days.

(21) Appl. No.: 15/893,767

(22) Filed: Feb. 12, 2018

(65) Prior Publication Data
US 2019/0252949 A1  Aug. 15, 2019

(51) Int. Cl.
| | | |
|---|---|---|
| H02K 9/19 | (2006.01) | |
| H02P 27/06 | (2006.01) | |
| H02K 11/33 | (2016.01) | |
| H05K 1/14 | (2006.01) | |
| H05K 7/14 | (2006.01) | |
| H02M 7/537 | (2006.01) | |
| H02M 7/00 | (2006.01) | |
| H05K 7/20 | (2006.01) | |
| B60K 7/00 | (2006.01) | |

(52) U.S. Cl.
CPC .............. *H02K 9/19* (2013.01); *B60K 7/0007* (2013.01); *H02K 11/33* (2016.01); *H02M 7/003* (2013.01); *H02M 7/537* (2013.01); *H02P 27/06* (2013.01); *H05K 1/141* (2013.01); *H05K 7/1432* (2013.01); *H05K 7/205* (2013.01); *H05K 7/2089* (2013.01); *H05K 7/20263* (2013.01); *H05K 7/20381* (2013.01); *H05K 2201/10166* (2013.01)

(58) Field of Classification Search
CPC ...... H02P 1/00; H02P 3/00; H02P 6/00; H02P 21/00; H02P 27/04; H02P 27/06; H02P 23/00; H02P 25/00; H02P 27/00; H02P 41/00; G05D 23/00; G05B 5/00; H02K 9/19; H02K 11/33; H05K 1/141; H05K 7/1432; H05K 2201/10166; H05K 7/20381; G01K 17/00; G01P 5/10; B60K 7/0007
USPC .......... 318/471, 472, 400.01, 700, 701, 727, 318/799, 800, 801; 361/23, 30; 363/40, 363/44, 95, 175
See application file for complete search history.

(56) References Cited

U.S. PATENT DOCUMENTS

| | | | | |
|---|---|---|---|---|
| 5,625,548 A | * | 4/1997 | Gold ................. | H02M 1/08 363/98 |
| 5,953,224 A | * | 9/1999 | Gold ................. | H02M 1/08 363/14 |

(Continued)

*Primary Examiner* — Antony M Paul
(74) *Attorney, Agent, or Firm* — The Law Office of Kevin M. Welch; Kevin Matthew Welch (57) ABSTRACT

A compact and thermally efficient traction drive motor inverter featuring an integrated printed circuit board carrying both power circuitry and signal circuitry on separate electrically isolated layers without significant electromagnetic interference. Electrical communication with subsequent electrically isolated layers is maintained through the use of plated blind vias. Thermal efficiency is improved by utilizing a liquid cooled insulated gate bipolar transistor module with featuring internal flow balancers to optimize coolant flow.

4 Claims, 5 Drawing Sheets

(56) References Cited

U.S. PATENT DOCUMENTS

| | | | |
|---|---|---|---|
| 9,099,933 B2* | 8/2015 | Jones | H05K 7/1432 |
| 2007/0080360 A1* | 4/2007 | Mirsky | H01L 33/642 |
| | | | 257/99 |

* cited by examiner

COMPACT THERMALLY EFFICIENT TRACTION MOTOR INVERTER

FIELD OF THE PRESENT DISCLOSURE

This disclosure relates generally to electric vehicle technology and more specifically to an improved traction motor inverter featuring a compact and thermally efficient design including an integrated printed circuit board capable of carrying both power and signal circuitry on electrically isolated layers with low electromagnetic interference and superior heat transfer performance achieved through innovative coolant flow optimization.

BACKGROUND OF THE RELATED ART

An essential component in many electrically operated vehicles is the traction drive motor inverter. This component is necessary because most electrically powered vehicles are propelled by a traction drive motor that requires alternating current (AC) power and, typically, the available portable electrical power supply is an electrochemical cell of some variety that provides a stable supply of direct current (DC) power. A traction drive motor inverter converts the available DC power into AC power so that such power may be effectively utilized.

The process of converting DC power to AC power with the preferred wave form and phase is quite involved requiring multiple component parts including a controller, X and Y capacitors, a switch mode power supply, an insulated-gate bipolar transistor, and several printed circuit boards for supporting both high voltage, high current circuitry or "power circuitry" and low voltage, low current gate driver circuitry or "signal circuitry." In the legacy orientation, the power and signal circuitry are supported on separate printed circuit boards to prevent electromagnetic induction or electrostatic coupling caused by the electromagnetic energy field associated with the current flowing through the power circuitry from degrading, causing failures, or otherwise interfering with the signal circuitry.

However, the use of separate printed circuit boards for power circuitry and signal circuitry causes the traditional traction motor inverter modules to be larger than would otherwise be necessary if such printed circuit boards could be combined. If the power circuitry and signal circuitry of a traction motor inverter could be combined onto a single multiple layer integrated power-signal printed circuit board with sufficient electromagnetic shielding so as to prevent the power circuitry from significantly interfering with the signal circuitry then the overall traction motor inverter module could be reduced in size, providing a competitive advantage over legacy designs.

As with many industries, the electrical vehicle industry is innovating at a rapid rate and there is considerable pressure to increase performance and/or decrease the physical size of such components. Even incremental improvements on this front can prove to be valuable advantages in such a competitive marketplace. There exists a need to provide a traction motor inverter that features a multiple layer printed circuit board that is capable of supporting both the power circuitry and the signal circuitry on separate electrically isolated layers without experiencing excessive interference issues from electromagnetic radiation.

Another important design concern of traction motor inverters is heat dissipation. Due to the high voltage and high current necessary to drive traction motors, traction motor inverters can generate substantial amounts of heat. This can be problematic if the heat is not dissipated efficiently because excessive heat buildup may result in many undesirable effects such as premature deterioration of materials and/or circuitry failure, both intermittent and permanent. In many situations, such heat dissipation concerns can be performance limiting as systems are intentionally governed or restricted so as to prevent heat generation from outpacing the capabilities of the legacy design's heat dissipation abilities. In such cases, even modest improvements in heat dissipation technology could yield immediate performance gains as such improvements would allow the device to increase the power to a higher power at which it is capable of operating. Alternately, the device could be redesigned to be smaller, more energy efficient, or demonstrate increased power density.

Recent innovations in flow optimization of liquid cooled power semiconductor devices have yielded improved thermal efficiencies by optimizing the flow distribution across heat dissipation surfaces. Such improvements may be integrated into a traction motor inverter to facilitate cooler operating temperatures, longer operation, increased power efficiency, increased power capability, and/or allow for the overall apparatus redesign to be physically smaller. Such innovation is described in detail in U.S. utility patent application Ser. No. 15/787,711 (the "'711 application") which was an improvement on U.S. Pat. No. 9,443,786 (the "'786 patent"). The '786 patent and the '711 application are hereby incorporated by reference in their entirety into this specification, including the abstracts, entire specifications, drawings, and claims. There exists a need for a traction motor inverter that incorporates and exploits the innovative power semiconductor cooling technology disclosed in '786 patent and improved upon by the innovative disclosures of the '711 application in the context of a traction motor inverter.

The present disclosure distinguishes over the related art providing heretofore unknown advantages as described in the following summary.

BRIEF SUMMARY OF THE INVENTION

As previously stated, the field of electric vehicle technology is experiencing rapid innovation creating considerable economic demand for innovative component parts that are smaller, more thermally efficient, exhibit higher power density, and/or are capable of sustaining higher power. The present disclosure describes an innovative highly compact and thermally efficient traction motor inverter that provides such demanded advantages.

Specifically, the present disclosure teaches a traction motor inverter featuring an innovative multilayer integrated printed circuit board supporting both the high voltage, high current power circuitry and the low voltage, low current gate driver, signal circuitry on separate electrically isolated layers. The AC and DC busbars are designed into the printed circuit can handle as much as 400 A for an 80 kW motor. The power circuitry layers and signal circuitry layers are electrically isolated by alternate layers electrically nonconductive material. Multiple plated blind vias are utilized to facilitate external electronic communication with internally situated electrically active layers. This use of multiple plated blind vias facilitates the electrical communication while distributing the electrical stress and providing favorable thermal relief and mechanical continuity.

The innovative integration of the power circuitry and gate driver signal circuitry into a single printed circuit board allows for a traction motor inverter design with a more compact overall footprint than legacy designs because it eliminates need for the physical space typically allocated to separate power and signal printed circuit boards and separate AC and DC busbars. The present disclosure also eliminates the need for an electromagnetic plate that is sometimes included in legacy designs to reduce electromagnetic radiation because, in the present disclosure, the electrically nonconductive material between the electrically active layers of the printed circuit board serves to shield such electromagnetic radiation.

In a preferred embodiment, the electrically active layers are separated by layers of FR-4 grade glass reinforced epoxy laminate ("FR4"). While this is a common material for constructing multi-layer printed circuit boards, it is not common to use layers of FR4 that are 20 mils thick, which is what makes this presently disclosed innovative integration possible. Traditional 9 mil thick FR4 layers cannot adequately shield the signal circuitry from the range of high voltage and current typically required by traction motors, which may be one reason why such power-signal printed circuit board integration has not previously been successfully implemented in the field of traction motor inverters. An important key to the success of the presently disclosed innovation in the additional thickness of the nonconductive layers which serves to increase the electromagnetic radiation shielding to an acceptable level.

Through testing, it has been determined that 20 mils of FR4 is sufficiently thick enough to shield the signal circuitry from electromagnetic interference when the power circuitry is experiencing voltage of 360 Vdc and peak amperage of 400 A switching at 10 kHz powering a traction drive motor at 7000 RPM. This determination was made by observing minimal distortion in the gate driver signal wave form when shielded by 20 mils of FR4. Exemplar graphs of such gate driver signal wave form test results reflecting minimal distortion have been included in this specification.

It is also foreseeable that higher power embodiments may require additional thickness to achieve an acceptable level of electromagnetic shielding. The thickness of the nonconductive layers can be increased until acceptable shielding is observed. Further, additional embodiments may use material other than FR4 grade glass reinforced epoxy laminate which may require a different minimum thickness to provide adequate shielding, depending on its electromagnetic qualities. The present disclosure contemplates that the power circuitry and the signal circuitry be integrated into a single printed circuit board with a layer of nonconductive material of an appropriate thickness to provide adequate electrometric shielding and the use of multiple plated blind vias to facilitate and maintain robust electrical communication with subsequent, internally situated electrically active layers.

The presently disclosed traction motor inverter also features an innovative liquid cooled insulated-gate bipolar transistor module as disclosed in the '711 application. The traction motor inverter benefits from innovative liquid cooled insulated-gate bipolar transistor module because it has demonstrated an ability to reduce the temperature of the power semiconductors devices by as much as thirty-three percent (33%) compared to the legacy designs without the innovative modification. This reduction in temperature protects the integrity of the traction motor inverter when experiencing strenuous duty, increases its thermal and electrical efficiency, and possibly allows the traction motor inverter to handle higher power or be redesigned physically smaller than competitive devices featuring legacy liquid cooled insulated-gate bipolar transistor modules.

As set forth in greater detail in the '711 application, the liquid cooled insulated-gate bipolar transistor module includes a manifold with an influent that leads to a first plenum and effluent that draws from a second plenum and a heat exchange surface in thermal communication with at least one power semiconductor device located between the first and second plenum such that coolant fluid must flow in close proximity to the heat exchange surface to flow from the first plenum to the second plenum and out of the apparatus.

The innovative flow balancers are located inside the first and second plenum and alter the internal cross sectional area of the first and second plenums, thereby altering the cross sectional area along the length of each plenum which, in turn, alters the hydrostatic pressure along the length of the manifold and affects the flow distribution of coolant fluid along the length of the heat exchange surface.

The flow balancers may take the form of removable physical inserts or permanently affixed physical inserts located inside the first and/or second plenum to alter the plenum cross sectional area. Alternatively, in some embodiments, the flow balancers may be physical design alterations of the shape of the plenum walls to achieve the same effect.

Through manipulating the shape of the first and second plenums with flow balancers, the hydrodynamic pressure in the manifold can be altered to either induce even flow distribution along the length of the heat exchange surface or purposefully uneven or custom flow distributions.

According to Computational Fluid Dynamics (CFD) analysis, the use of flow balancers could improve junction temperatures of power semiconductors experiencing similar loading up to twenty-five percent (25%). Actual testing yielded even better results, showing temperature reductions as much as thirty-three percent (33%). These temperature reductions are significant and can translate into very important performance benefits which, depending on the technology, may allow devices to operate longer, consume less power, tolerate or endure higher power, and/or be redesigned to be physically smaller.

Incorporating the improved liquid cooled insulated-gate bipolar transistor module as disclosed in the '711 application into the presently disclosed traction motor inverter further increases its competitive advantage and distinguishes the present disclosure over legacy designs.

This disclosure teaches certain benefits in construction and use which give rise to the objectives described below:

A primary objective inherent in the above described apparatus is to provide advantages not taught by the prior art;

Another objective is to provide an innovative traction drive motor inverter with fewer component parts;

A further objective is to provide an innovative traction drive motor inverter exhibiting a smaller physical size and footprint.

A still further objective is to provide a traction drive motor inverter with increased thermal efficiency.

Other features and advantages of the present invention will become apparent from the following more detailed description, taken in conjunction with the accompanying drawings, which illustrate, by way of example, the principles and features of the presently described apparatus.

BRIEF DESCRIPTION OF THE SEVERAL VIEWS OF THE DRAWING(S)

The accompanying drawings illustrate various exemplary implementations and are part of the specification. The illustrated implementations are proffered for purposes of example not for purposes of limitation. Illustrated elements will be designated by numbers. Once designated, an element will be identified by the identical number throughout. Illustrated in the accompanying drawing(s) is at least one of the best mode embodiments of the present disclosure. In such drawing(s).

DETAILED DESCRIPTION OF THE EXEMPLARY EMBODIMENT

The above described drawing figures illustrate an exemplary embodiment of presently disclosed apparatus and its many features in at least one of its preferred, best mode embodiments, which is further defined in detail in the following description. Those having ordinary skill in the art may be able to make alterations and modifications to what is described herein without departing from its spirit and scope of the disclosure. Therefore, it must be understood that what is illustrated is set forth only for the purposes of example and that it should not be taken as a limitation in the scope of the present apparatus or its many features.

Figure 1:
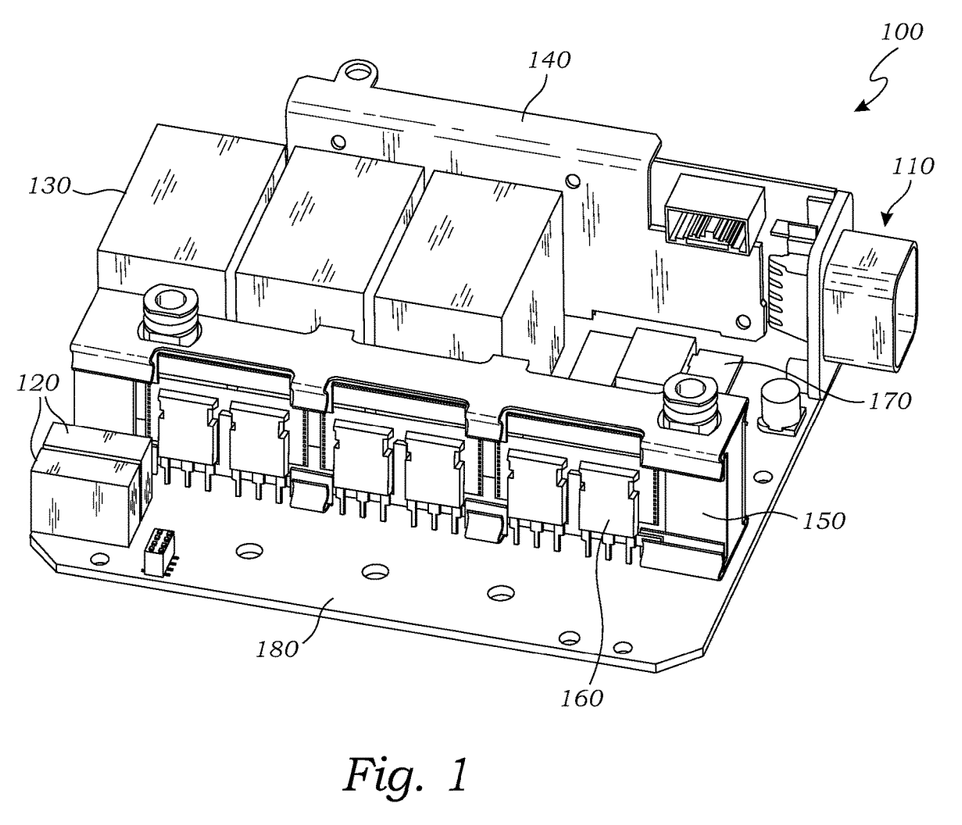
FIG. 1 is a perspective view of an exemplary embodiment of the presently disclosed compact thermally efficient traction motor inverter featuring an innovative multilayer power-signal integrated printed circuit board and a flow-balanced liquid cooled insulated-gate bipolar transistor power module.
Figure 2:
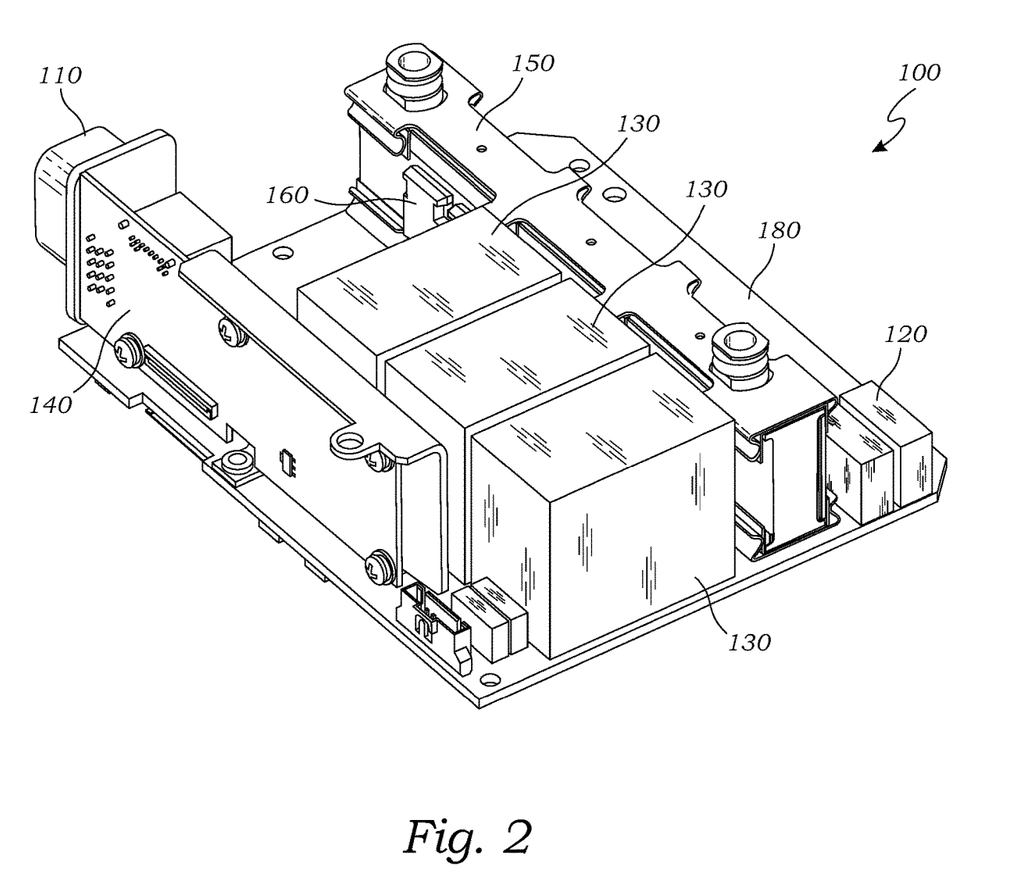
FIG. 2 is a second perspective view of an exemplary embodiment of the presently disclosed compact thermally efficient traction motor inverter featuring an innovative multilayer power-signal integrated printed circuit board and a flow-balanced liquid cooled insulated-gate bipolar transistor power module.

Described now in detail is the presently disclosed innovative traction motor inverter. FIGS. 1 and 2 both illustrate the presently disclosed apparatus 100 from different perspective views. The various illustrated component parts are: a controller 140; three X capacitors 130; two Y capacitors 120; a switch mode power supply 170; and a flow-balanced liquid cooled insulated-gate bipolar transistor module 150 with various power semiconductors devices 160 mounted externally, as disclosed in the '711 application, all components are mounted on and in electronic communication with an innovative multilayer power-signal integrated printed circuit board 180. This arrangement is presented as an exemplar embodiment and neither the overall appearance, orientation, or particular size, number, or arrangement of the X and Y capacitors 130, 120 or power semiconductor devices 160 are critical to this disclosure.

Further, the insulated-gate bipolar transistor module 150 may take on other configurations, including the use of smaller modules or multiple modules 150, depending on the need to increase or decrease the power capability.

Figure 3:
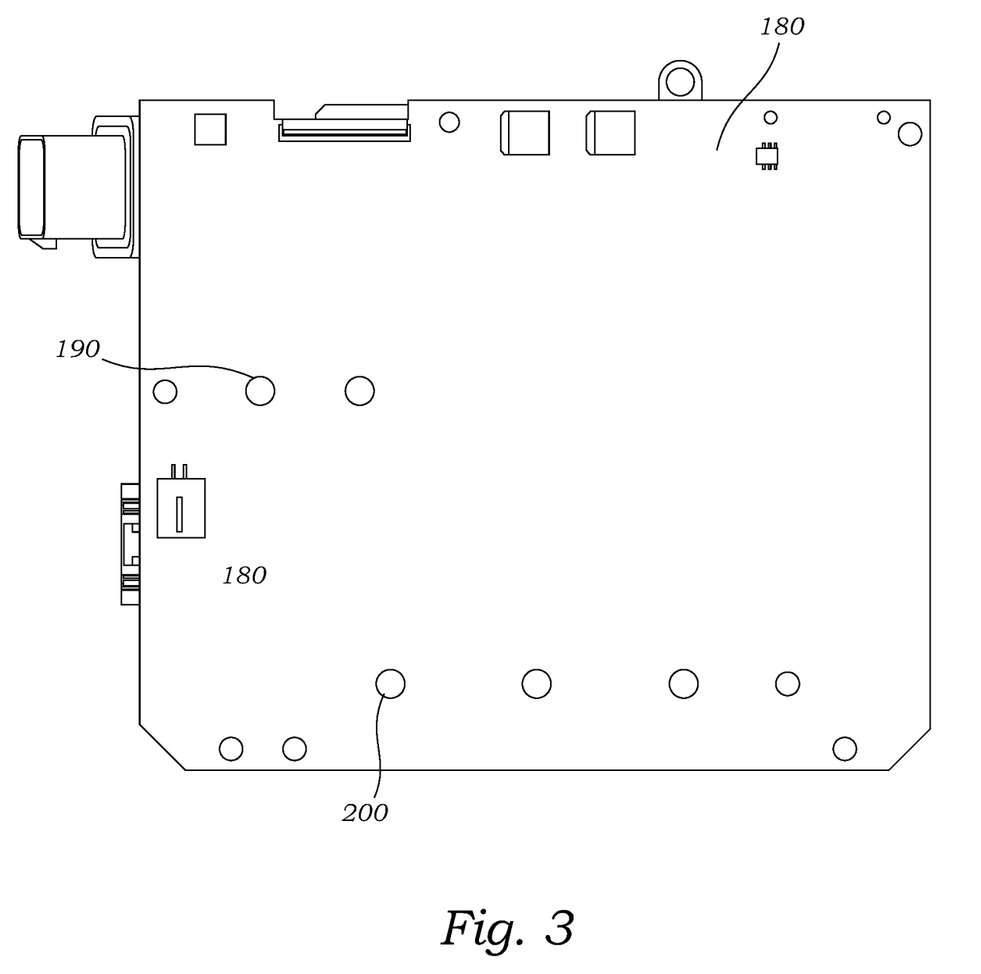
FIG. 3 is a plan bottom view of the an exemplary embodiment of the presently disclosed compact thermally efficient traction motor inverter featuring an innovative multilayer power-signal integrated printed circuit board a flow-balanced liquid cooled insulated-gate bipolar transistor module.

FIG. 3 illustrated the bottom of the innovative multilayer power-signal integrated printed circuit board 180. From this perspective the DC power input 190 and the AC power output 200 are visible. These contact points are designed to handle high voltage and high current as they have eliminated the need for the AC and DC busbars of standard designs.

Figure 4:
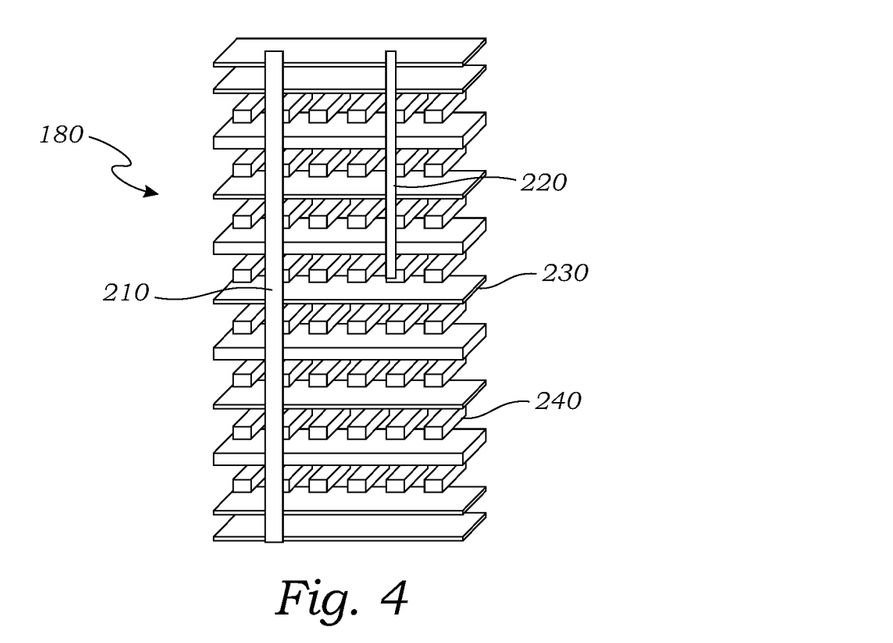
FIG. 4 is an expanded perspective view of an innovative multilayer power-signal integrated printed circuit board featuring both high voltage high current circuitry and low voltage gate driver circuitry integrated into a single multilayer printed circuit board with low levels electromagnetic interference, featuring conductive plated vias that connect circuitry between various layers, some of which terminate blindly at internal layers and others that extend entirely through the printed circuit board.

FIG. 4 illustrates the multiple isolated electrically active layers 240 containing interconnected by plated through vias 210 for power circuitry and plated blind vias 220 for signal circuitry separated and shielded from electromagnetic radiation by nonconductive layers 230 of either FR4 or a similar material. In testing it was determined that 20 mil layers 230 of FR4 was sufficient to prevent excessive noise in the gate driver signal caused by electromagnetic radiation when experiencing 360 Vdc and 7000 RPM, however, this measurement may have to be tailored if higher power is required. Similarly, other material may require different thickness to adequately shield the signal circuitry from the electromagnetic radiation from the power circuitry.

Figure 5:
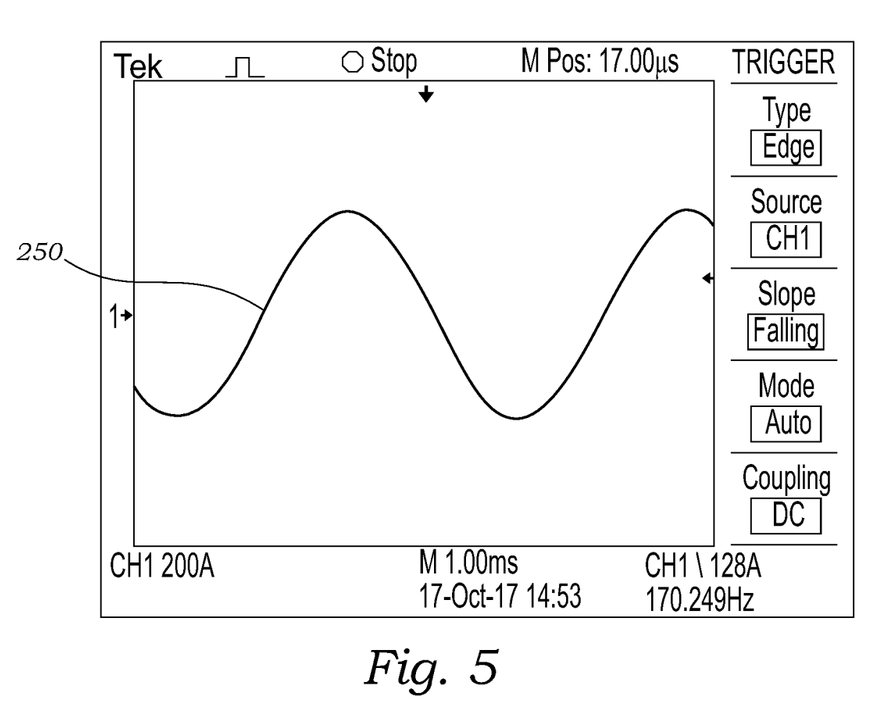
FIG. 5 is a graph of the alternating current output wave shape from test results of the presently disclosed traction motor inverter operating at motor peak phase current (400 A) at 360 V and 7000 RPM.
Figure 6:
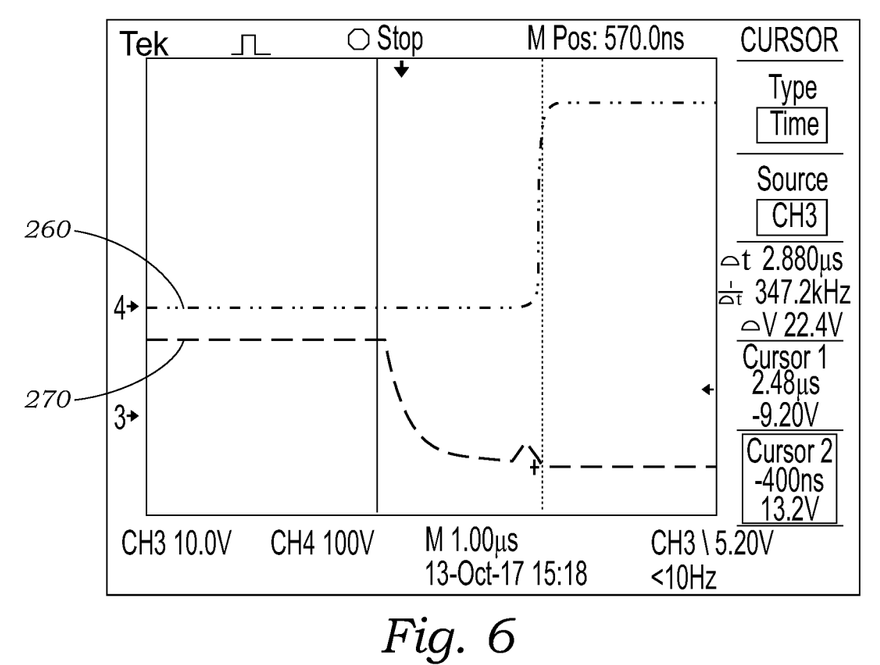
FIG. 6 is a graph of test results showing the turn-off gate signal to the gate to emitter voltage ($V_{GE}$) and the collector to the emitter voltage ($V_{CE}$) demonstrating that the signal voltage is not excessively noisy; therefore the electromagnetic interference from the power circuitry mounted on a different plane of the same printed circuit board is not excessive.
Figure 7:
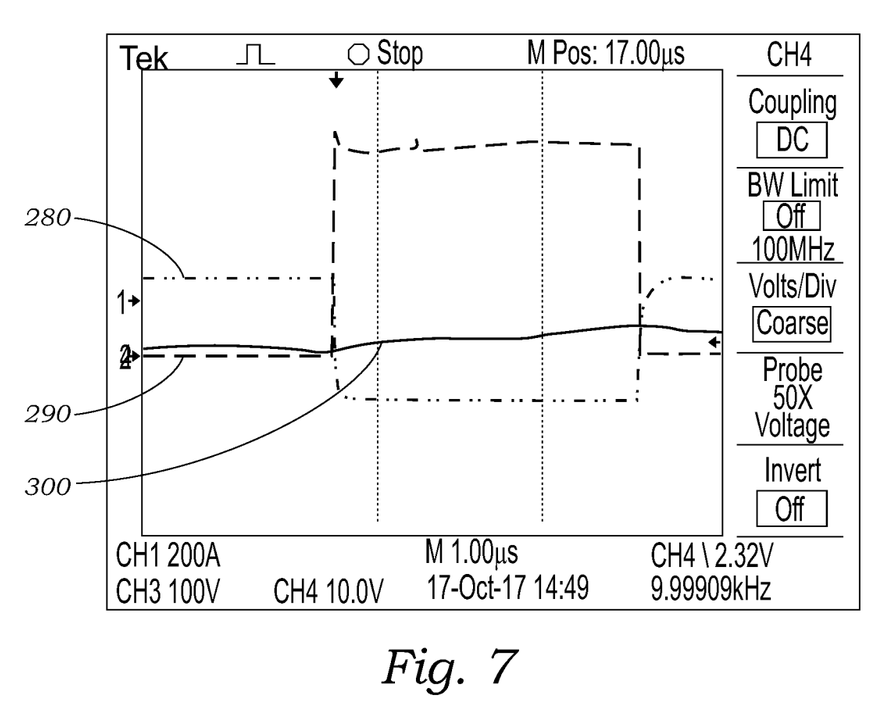
FIG. 7 is a graph of test results from one whole switching cycle switching at 10 kHz demonstrating that the emitter voltage ($V_{GE}$) and the collector to the emitter voltage ($V_{CE}$) is not excessively noisy meaning that there is not excessive electromagnetic interference from the power circuitry mounted on a different plane of the same printed circuit board.

FIGS. 5, 6, and 7 illustrate wave form test results indicating that noise is minimal and therefore electromagnetic shielding of the 20 mil layer of FR4 is adequate. FIG. 5 shows the motor phase current at 360 Vdc and 7,000 RPM. FIG. 6 illustrates the turn OFF gate signal to the emitter voltage ($V_{GE}$), and FIG. 7 shows the entire switching cycle at 10 kHz. The importance of these graphs is the minimal noise they exhibit suggesting minimal electromagnetic interference and therefore minimal electrical stress.

The enablements described in detail above are considered novel over the prior art of record and are considered critical to the operation of at least one aspect of the apparatus and its method of use, and to the achievement of the above-described objectives. The words used in this specification to describe the instant embodiments are to be understood not only in the sense of their commonly defined meanings, but to include by special definition in this specification: structure, material, or acts beyond the scope of the commonly defined meanings. Thus, if an element can be understood in the context of this specification as including more than one meaning, then its use must be understood as being generic to all possible meanings supported by the specification and by the word(s) describing the element.

The definitions of the words or drawing elements described herein are meant to include not only the combination of elements which are literally set forth, but all equivalent structures, materials or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim.

Changes from the claimed subject matter as viewed by a person with ordinary skill in the art, now known or later devised, are expressly contemplated as being equivalents within the scope intended and its various embodiments. Therefore, substitutions, now or later known to one with ordinary skill in the art, are defined to be within the scope of the defined elements. This disclosure is thus meant to be understood to include what is specifically illustrated and described above, what is conceptually equivalent, what can be obviously substituted, and also what incorporates the essential ideas.

The scope of this description is to be interpreted only in conjunction with the appended claims and it is made clear, here, that each named inventor believes that the claimed subject matter is what is intended to be patented.

What is claimed:

1. A compact and thermally efficient traction motor inverter apparatus, said apparatus comprising:
   a controller in electrical communication with;
   a switch-mode power supply;
   at least one capacitor;
   a liquid cooled insulated-gate bipolar transistor power module; and
   a multilayer printed circuit board with a plurality of electrically isolated layers,
   wherein at least one said electrically isolated layer is populated with low voltage, low current gate driver circuitry, and at least one electrically isolated layer is populated with high voltage high current circuitry,
   wherein subsequent electrically isolated layers of said multilayer printed circuit board maintain external electrical communication through plated blind vias.

2. An apparatus as in claim 1 wherein said liquid coded insulated-gate bipolar transistor power module includes at least one plenum and at least one flow balancer located in said plenum specifically shaped to manipulate the hydrodynamic pressure of the cooling fluid to optimize coolant fluid flow distribution through said insulated-gate bipolar transistor power module.

3. An apparatus as in claim 2 wherein electrically non-conductive material to reduce electromagnetic interference is FR4 grade glass-reinforced epoxy laminate.

4. An apparatus as in claim 1 wherein said subsequent electrically isolated layers of said multilayer printed circuit board are separated by layers of at least 20 mils of electrically non-conductive material to reduce electromagnetic interference between said electrically isolated layers.

* * * * *